(12) United States Patent
Li

(10) Patent No.: US 8,590,359 B2
(45) Date of Patent: Nov. 26, 2013

(54) PIN REGULATOR FOR ELECTRONIC COMPONENTS

(75) Inventor: Hai-Yuan Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 1097 days.

(21) Appl. No.: 12/548,405

(22) Filed: Aug. 26, 2009

(65) Prior Publication Data

US 2010/0313411 A1    Dec. 16, 2010

(30) Foreign Application Priority Data

Jun. 11, 2009  (CN) .......................... 2009 1 0303176

(51) Int. Cl.
*B21D 5/02*  (2006.01)

(52) U.S. Cl.
USPC ............................. 72/380; 140/105; 72/31.03

(58) Field of Classification Search
USPC ......... 72/31.03, 112, 125, 380, 386; 140/105, 140/147
See application file for complete search history.

(56) References Cited

U.S. PATENT DOCUMENTS

| | | | | |
|---|---|---|---|---|
| 2,971,555 A * | 2/1961 | Paulson | .......................... | 72/125 |
| 3,106,945 A * | 10/1963 | Wright et al. | ................. | 140/147 |
| 3,349,813 A * | 10/1967 | Pastuszak | ...................... | 140/147 |
| 3,779,291 A * | 12/1973 | Yeo | ................. | 140/147 |
| 3,815,205 A * | 6/1974 | Fletcher et al. | ................. | 72/301 |
| 4,103,718 A * | 8/1978 | Steigerwald | ................. | 140/105 |
| 4,371,013 A * | 2/1983 | Camp | ......................... | 140/147 |
| 4,945,954 A * | 8/1990 | Wehrly et al. | ................. | 140/105 |
| 5,697,801 A * | 12/1997 | Tsuji et al. | ..................... | 439/310 |
| 7,218,096 B2 * | 5/2007 | Huang et al. | ............. | 324/750.25 |

FOREIGN PATENT DOCUMENTS

CN          101312641 A     11/2008

* cited by examiner

*Primary Examiner* — Edward Tolan
(74) *Attorney, Agent, or Firm* — Altis & Wispro Law Group, Inc.

(57) ABSTRACT

A pin regulator for an electronic component includes a base seat, a regulating member rotatably connected on the base seat, and a driving module assembled on the base seat. The base seat defines a latching groove, and a sidewall of the latching groove defines a plurality of regulating slots to receive the pins of the electronic component therein. The driving module is rotatably connected to the regulating member to engage the regulating member in the latching groove.

19 Claims, 6 Drawing Sheets

PIN REGULATOR FOR ELECTRONIC COMPONENTS

BACKGROUND

1. Technical Field

The present disclosure generally relates to a pin regulator for an electronic component.

2. Description of Related Art

Electronic components, such as an integrated circuit chip, generally utilize a plurality of pins to connect with a printed circuit board. The pins are thin, and can be easily bent or deformed during assembly or transport. In a subsequent process the deformed pins cannot be accurately received in corresponding jacks defined in the printed circuit board. In common practice, bent or deformed pins are manually returned to a normal state. However, such practice is easily prone to human error. As a result, unqualified integrated circuit chips cannot be accurately regulated, and in a subsequent process, cannot be successfully applied. In addition, the above means is time-consuming and inefficient, incurring a high manufacturing cost.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views, and all the views are schematic.

DETAILED DESCRIPTION

Figure 1:
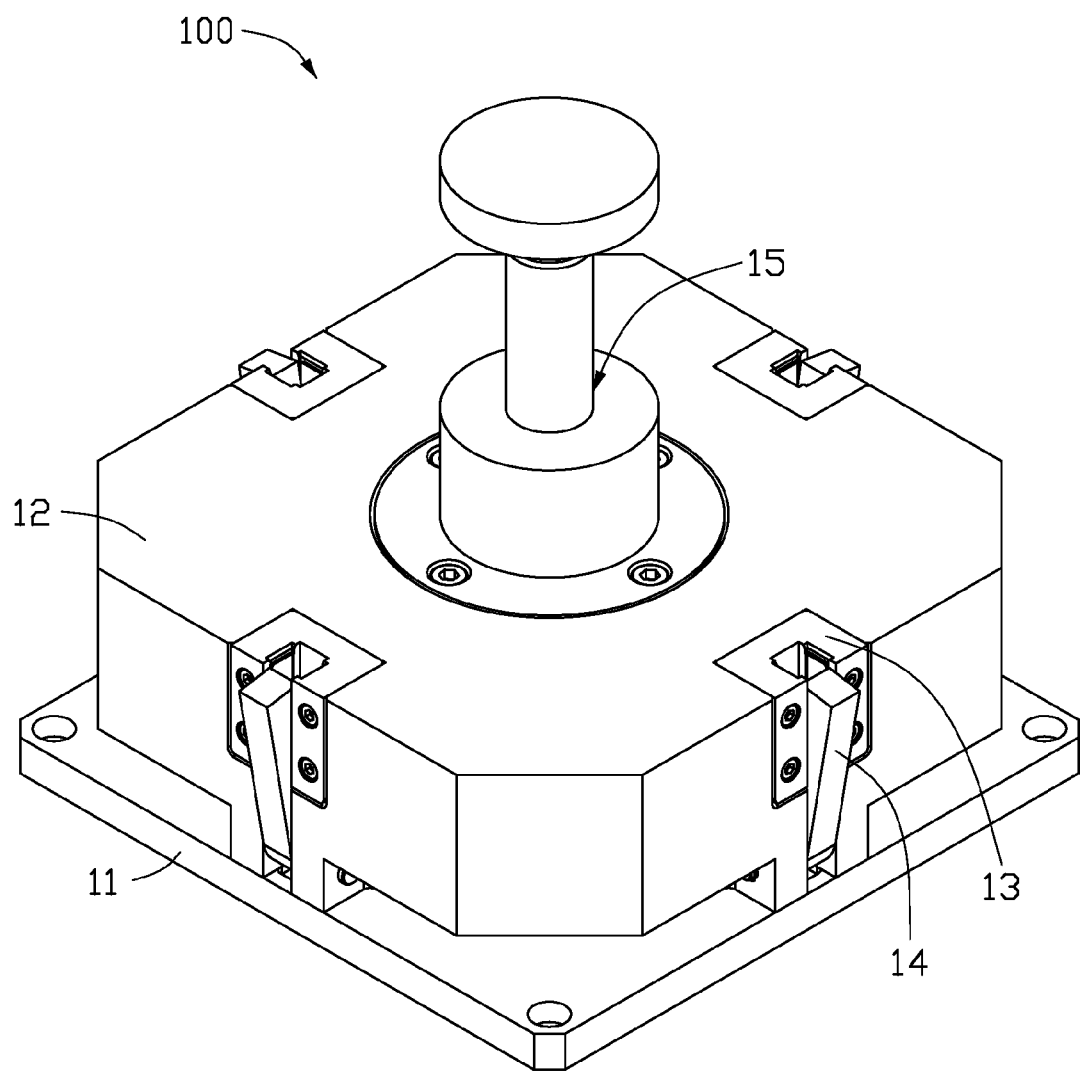
FIG. 1 is an assembled, isometric view of an embodiment of a pin regulator for an electronic component, the pin regulator including a base seat and a latching member.

Referring to FIG. 1, an embodiment of a pin regulator 100 for an electronic component includes a main plate 11, a base seat 12, four latching members 13, four regulating members 14, and a driving module 15. The base seat 12 is positioned on the main plate 11. The latching members 13 are positioned on four sides of the base seat 12. The driving module 15 is assembled on the base seat 12 to engage the regulating members 14 with the latching members 13.

Figure 2:
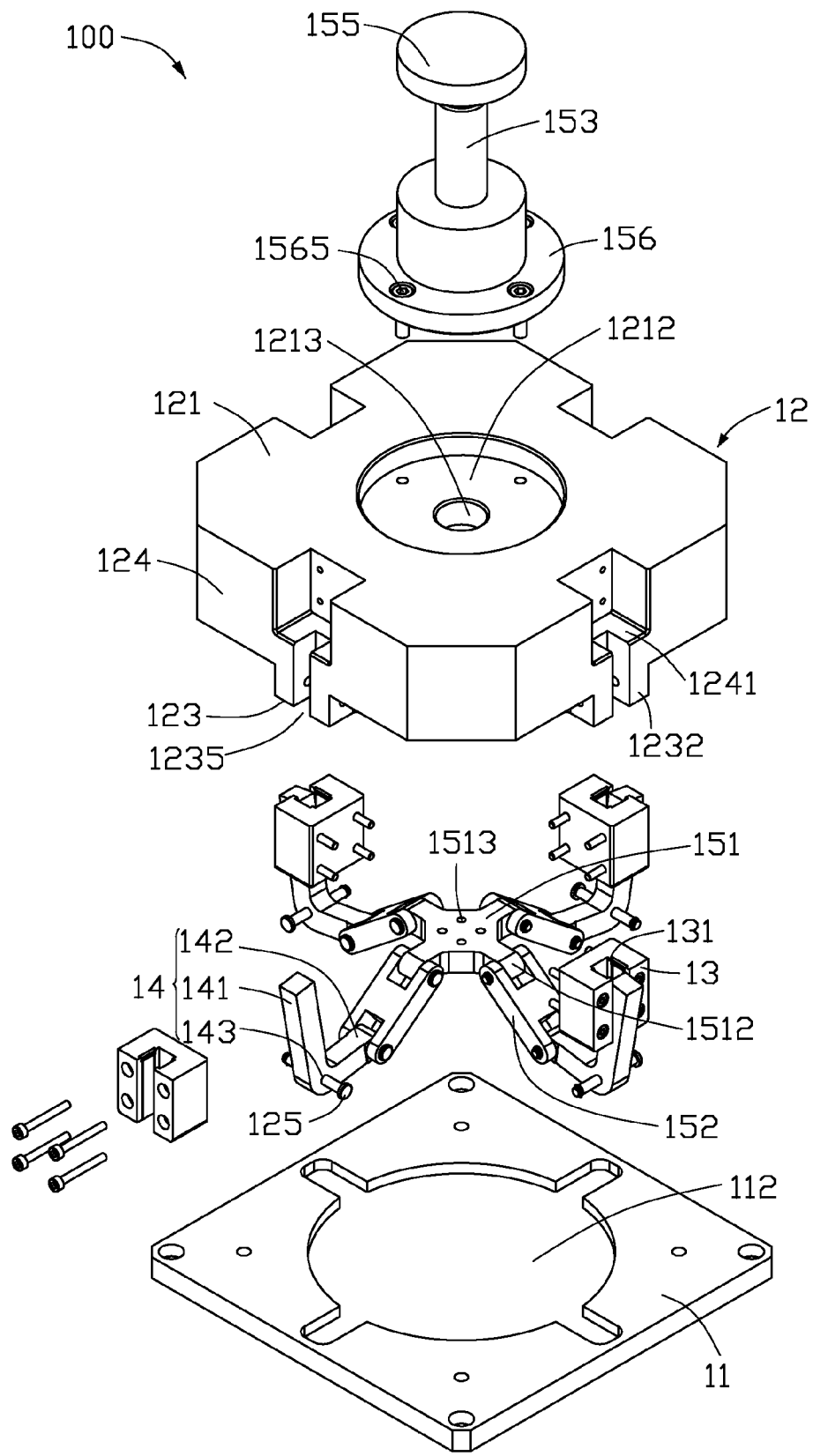
FIG. 2 is an exploded, isometric view of the pin regulator in FIG. 1.

Referring to FIG. 2, the main plate 11 can be a substantially rectangular plate, and defines a receiving groove 112 in the center thereof.

Figure 3:
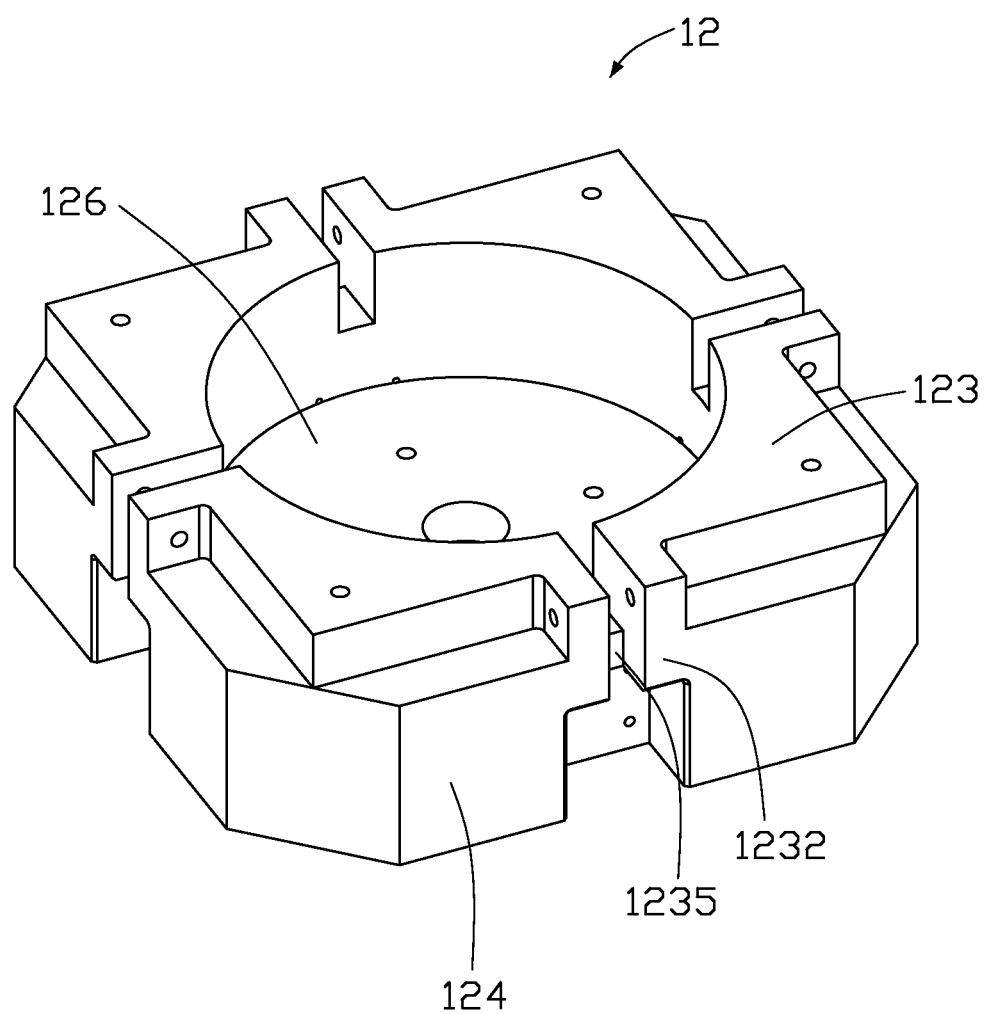
FIG. 3 is an isometric view of the base seat of the pin regulator in FIG. 1.

Referring also to FIG. 3, the base seat 12 can be a substantially rectangular block, and includes a first surface 121, a second surface 123 opposite to the first surface 121, and four side surfaces 124 connecting the first and second surfaces 121, 123. In the illustrated embodiment, the four corners of the base seat 12 are flattened. The first surface 121 defines a positioning groove 1212 in the center, and the bottom surface of the positioning groove 1212 defines a through hole 1213 extending through the base seat 12. The second surface 123 defines a cavity 126 in the center. Each side surface 124 defines a fixing groove 1241 adjacent to the first surface 121, and forms a connecting portion 1232 adjacent to the second surface 123. The fixing groove 1241 is a substantially rectangular groove receiving the latching member 13. The connecting portion 1232 defines an assembly groove 1235 through which the regulating member 14 extends, communicating with the fixing groove 1241 and the cavity 126.

Figure 4:
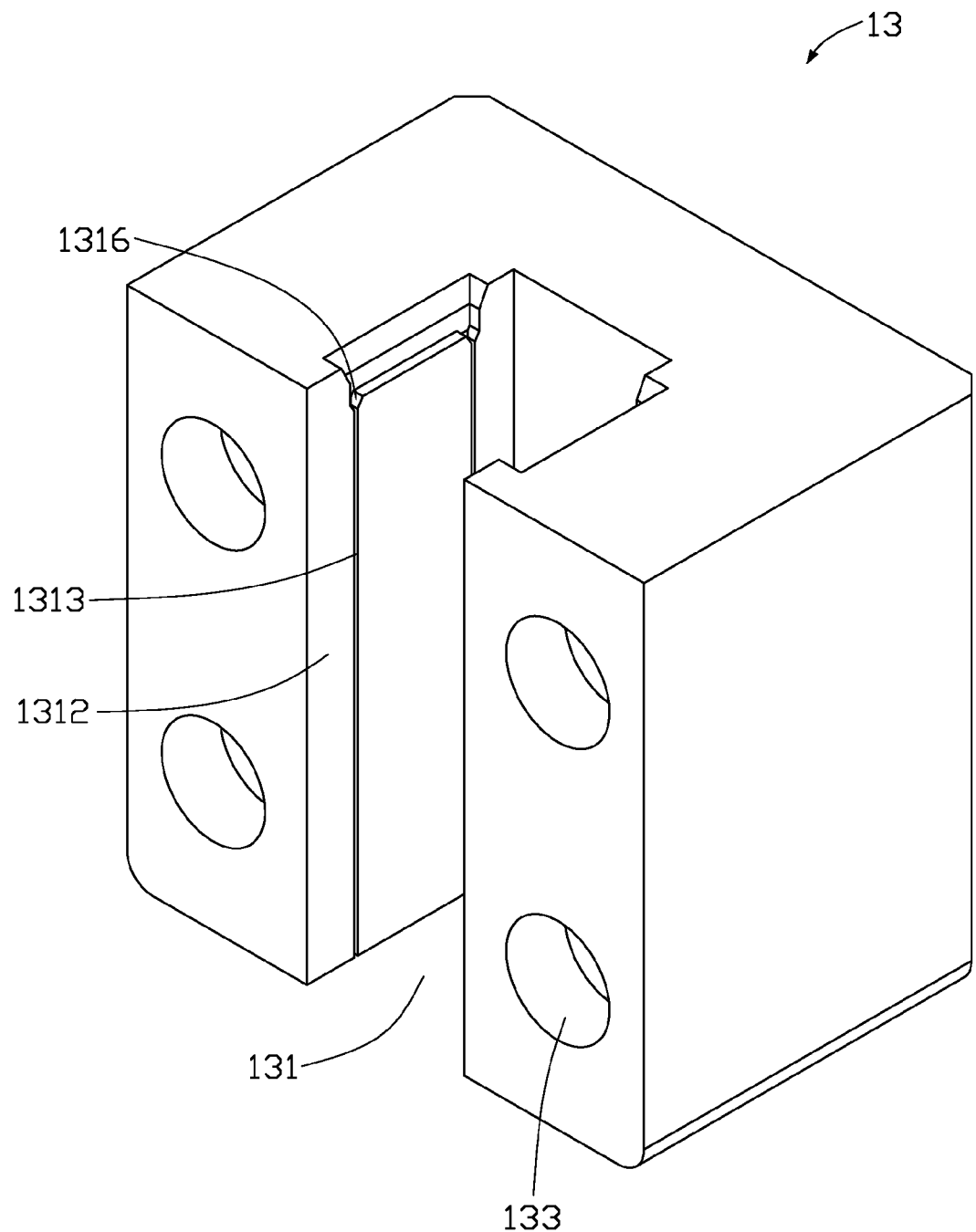
FIG. 4 is an isometric view of the latching member of the pin regulator in FIG. 1.

Referring also to FIG. 4, each latching member 13 can be a substantially rectangular block, and defines a latching groove 131 extending therethrough. A sidewall 1312 of the latching groove 131 defines two regulating slots 1313 extending along the same axis as the latching groove 131. The regulating slots 1313 receive pins of an electronic component therein. Each regulating slot 1313 has a flared opening 1316 to more easily receive pins of the electronic component. As shown, four regulating slots 1313 are defined in opposite sidewalls 1312 of the latching groove 131, although the number thereof can vary to accommodate different electronic components. The latching member 13 further defines a plurality of fixing holes 133 to fix the latching member 13 in the fixing groove 1241.

Each regulating member 14 can be a substantially L-shaped rod, and includes a regulating portion 141, a joint portion 142, and a bent portion 143. The joint portion 142 and the bent portion 143 both define a shaft hole (not labeled). The pin regulator 100 further includes a plurality of pivot shafts 125. One pivot shaft 125 extends through the shaft hole of the joint portion 142 to rotatably connect the regulating member 14 to the driving module 15. Another pivot shaft 125 extends through the shaft hole of the bent portion 143 to rotatably connect the regulating member 14 to the base seat 12.

Figure 5:
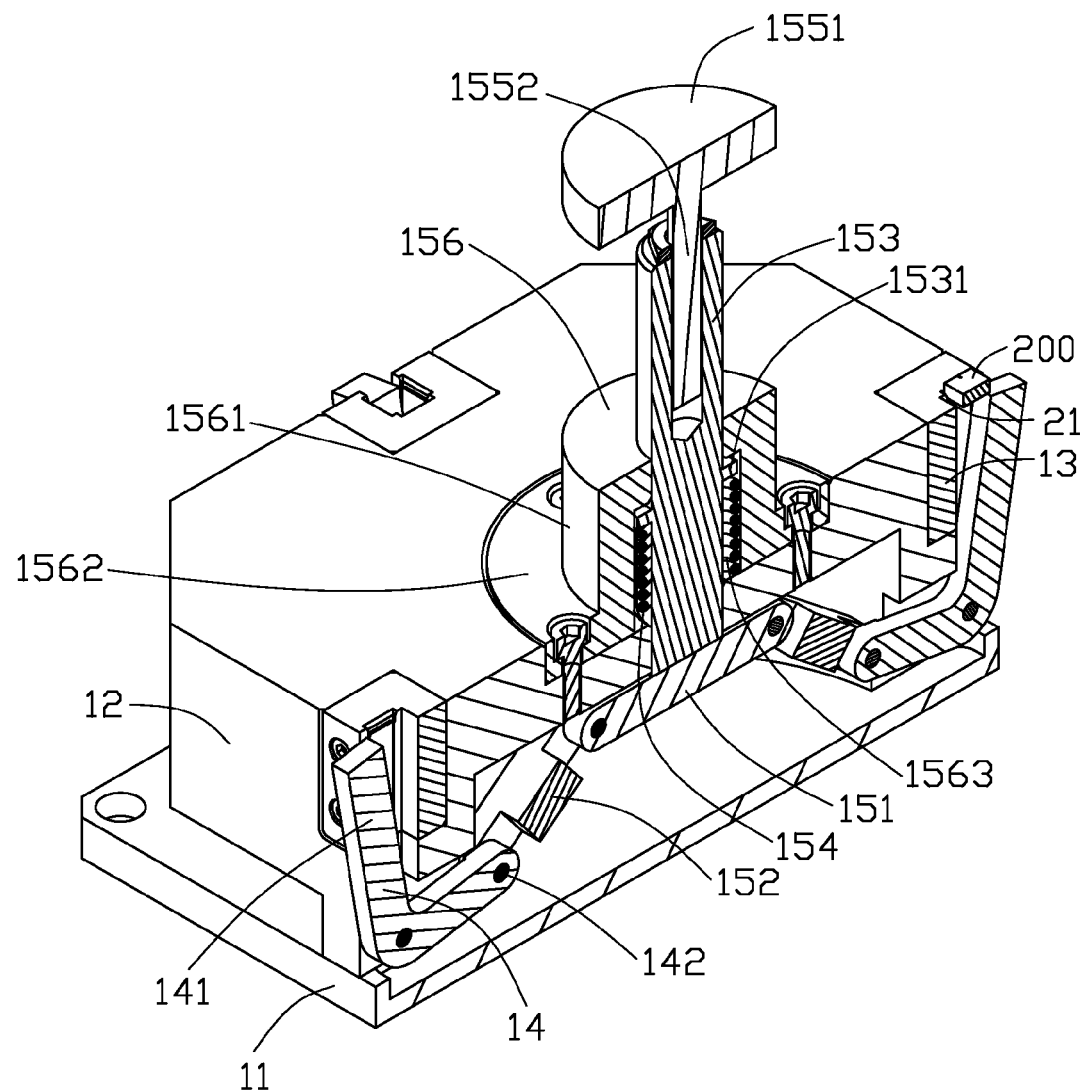
FIG. 5 is an isometric cross section of the pin regulator in FIG. 1.

Referring also to FIG. 5, the driving module 15 includes a connecting base 151, four connecting brackets 152, a pressing rod 153, an elastic member 154, an operating member 155, and a main body 156. The connecting brackets 152 are rotatably connected to the connecting base 151. The pressing rod 153 extends through the main body 156 and the bottom end of the pressing rod 153 is fixed to the connecting base 151. The elastic member 154 is sleeved on the pressing rod 153 and positioned in the main body 156. The operating member 155 is positioned on the top end of the pressing rod 153 to facilitate employment of the pressing rod 153.

The connecting base 151 can be a substantially rectangular block, and includes four protruding portions 1512 extending from four corners thereof. The connecting base 151 defines a plurality of fixing holes 1513 to fix the connecting base 151 to the pressing rod 153.

Each connecting bracket 152 can be substantially H-shaped, with one end thereof rotatably connected to the protruding portion 1512 of the connecting base 151 via the pivot shaft 125, and the other end rotatably connected to the joint portion 142 of the regulating member 14 via the pivot shaft 125.

The pressing rod 153 can be substantially cylindrical and forms an abutting portion 1531 on the middle portion to compress the elastic member 154.

As shown, the elastic member 154 is a helical spring, but may alternatively be a plurality of spring washers, elastic rubber rings, or elastic cylinders.

The operating member 155 includes a substantially disk-shaped head 1551 and a positioning rod 1552 received in the pressing rod 153. Alternatively, the operating member 155 may be integrally formed with the pressing rod 153.

The main body 156 includes a sleeve 1561, and a flange 1562 formed on an end of the sleeve 1561. The main body 156 defines a receiving groove 1563 to receive the elastic member 154. The flange 1562 defines a plurality of assembly holes 1565 fixing the flange 1562 in the positioning groove 1212 of the base seat 12.

During assembly, the main body 156 is fixed on the base seat 12, the pressing rod 153 extends through the main body 156, the through hole 1213 of the base seat 12, and fixed to the connecting base 151. The elastic member 154 is sleeved on the pressing rod 153 and positioned in the receiving groove 1563 of the main body 156. The connecting base 151 together with the connecting brackets 152 is received in the cavity 126 of the base seat 12. The latching members 13 are fixed in the fixing grooves 1241. The regulating members 14 extend through the assembly grooves 1235 of the connecting portions 1232, and the bent portions 143 of the regulating members 14 are rotatably connected to the connecting portions 1232. Finally, the main plate 11 is fixed on the base seat 12.

Figure 6:
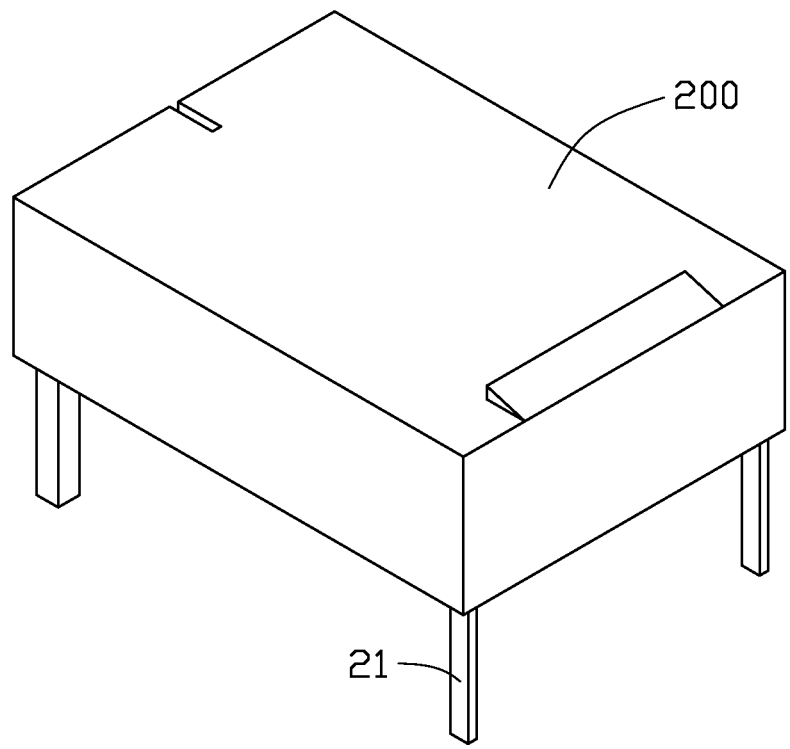
FIG. 6 is an isometric view of an embodiment of an electronic component to be regulated.

Referring also to FIG. 6, which shows an exemplary electronic component 200, operation of the pin regulator 100 is as follows. The electronic component 200 includes four pins 21 to be received in a printed circuit board. When regulating the pins 21, the electronic component 200 is seated on one latching member 13, and pins 21 are received in the regulating slots 1313 thereof. An external force is applied to the operating member 155 together with the connecting base 151, to move downwards. The elastic member 154 is compressed by the abutting portion 1531 of the pressing rod 153. The connecting brackets 152 rotate relative to the connecting base 151, and move the joint portions 142 downwards, such that the regulating members 14 rotate relative to the base seat 12, enabling the regulating portions 141 to engage in the latching grooves 131 of the latching members 13. Accordingly, the latching member 13 and the regulating member 14 cooperatively extrude the pins 21 from the regulating slots 1313, thus regulating the pins 21 to a normal state. Alternatively, the edges of the regulating portions 141 may be rounded or flattened to prevent damage during the forced extrusion.

After regulation, the external force applied on the operating member 155 is released and the pressing rod 153 and connecting base 151 move upwards due to the elastic force generated by the elastic member 154, thereby disengaging the regulating portions 141 from the latching grooves 131. Therefore, the electronic component 200 is easily separated from latching member 13. Alternatively, the elastic member 154 may be omitted After regulation, an external force can be applied to pull the pressing rod 153 and connecting base 151 upwards, and the regulating portions 141 can also be disengaged form the latching grooves 131.

The pin regulator accurately and efficiently regulates pins of an electronic component, thus decreasing manufacturing costs. To further improve efficiency, a robot manipulator may provide a plurality of electronic components onto the latching members 13, and after regulation, separate the components therefrom.

Alternatively, the number of latching members 13 and regulating members 14 may be varied. The connecting brackets 152 may be omitted, the connecting base 151 may define a plurality of sliding holes, and joint portions 142 may be elongated and inserted through the sliding holes. The latching members 13 may be omitted and the latching grooves 131 directly defined in the base seat 12.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A pin regulator for regulating pins of an electronic component, the pin regulator comprising:
   a base seat defining a fixing groove therein;
   a latching member fixed in the fixing groove, the latching member defining a latching groove, a sidewall of the latching groove defining a plurality of regulating slots configured to receive the pins of the electronic component therein;
   a regulating member rotatably connected to the base seat; and
   a driving module assembled on the base seat and rotatably connected to the regulating member to engage the regulating member in the latching groove.

2. The pin regulator of claim 1, wherein the regulating member is a substantially L-shaped rod, and comprises a regulating portion engaged in the latching groove, a joint portion rotatably connected to the driving module, and a bent portion rotatably connected to the base seat.

3. The pin regulator of claim 2, wherein the base seat defines a cavity to receive part of the driving module, and the base seat forms a connecting portion, the connecting portion defines an assembly groove communicating with the fixing groove and the cavity; the regulating member extends through the assembly groove; the bent portion of the regulating member is rotatably connected to the connecting portion.

4. The pin regulator of claim 1, wherein the driving module comprises a connecting base, a pressing rod extending through the base seat and fixed on the connecting base, and a connecting bracket having one end rotatably connected to the connecting base, and the other end rotatably connected to the regulating member.

5. The pin regulator of claim 4, wherein the driving module further comprises a main body and an elastic member, the main body is fixed on the base seat, and defines a receiving groove; the elastic member is sleeved on the pressing rod and positioned in the receiving groove; the pressing rod extends through the main body and forms an abutting portion to compress the elastic member.

6. The pin regulator of claim 4, wherein the driving module further comprises an operating member, the operating member comprises a substantially disk-shaped head and a positioning rod received in the pressing rod.

7. The pin regulator of claim 1, wherein the driving module comprises a connecting base, a pressing rod extending through the base seat and fixed on the connecting base; the connecting base defines a sliding hole through which the regulating member passes.

8. The pin regulator of claim 1, wherein the plurality of regulating slots extend along the same axis as the latching groove, and each regulating slot comprises a flared opening.

9. The pin regulator of claim 2, wherein the edges of the regulating portion are rounded or flattened.

10. The pin regulator of claim 1, further comprising a main plate assembled on the base seat, wherein the main plate defines a receiving groove, and the base seat defines a cavity; the receiving groove and the cavity cooperatively receive part of the driving module and part of the regulating member.

11. A pin regulator for regulating pins of an electronic component, the pin regulator comprising:
   a base seat defining a latching groove therein, a sidewall of the latching groove defining a plurality of regulating slots to receive the pins of the electronic component therein;
   a regulating member rotatably connected on the base seat; and a driving module assembled on the base seat, the driving module comprising:
　　a connecting base positioned in the base seat;
　　a pressing rod extending through the base seat and fixed on the connecting base; and
　　a connecting bracket comprising one end rotatably connected to the connecting base, and the other end rotatably connected to the regulating member;
　　wherein when the pressing rod moves downwards, the connecting bracket rotates relative to the connecting base and rotates the regulating member relative to the base seat, thus enabling the regulating member to engage the latching groove; when the pressing rod moves upwards, the regulating member disengages from the latching groove.

12. The pin regulator of claim 11, wherein the base seat defines a fixing groove; the pin regulator further comprises a latching member fixed in the fixing groove; the latching groove is defined in the latching member.

13. The pin regulator of claim 12, wherein the regulating member is a substantially L-shaped rod, and comprises a regulating portion engaged in the latching groove, a joint portion rotatably connected to connecting bracket, and a bent portion rotatably connected to the base seat.

14. The pin regulator of claim 13, wherein the base seat defines a cavity receiving part of the driving module, and the base seat forms a connecting portion, the connecting portion defines an assembly groove communicating with the fixing groove and the cavity; the regulating member extends through the assembly groove; the bent portion of the regulating member is rotatably connected to the connecting portion.

15. The pin regulator of claim 11, wherein the driving module further comprises a main body and an elastic member, the main body is fixed on the base seat, and defines a receiving groove; the elastic member is sleeved on the pressing rod and positioned in the receiving groove; the pressing rod extends through the main body and forms an abutting portion to compress the elastic member.

16. The pin regulator of claim 11, wherein the driving module further comprises an operating member, the operating member comprises a substantially disk-shaped head and a positioning rod received in the pressing rod.

17. The pin regulator of claim 11, wherein the plurality of regulating slots extend along the same axis as the latching groove, and each regulating slot comprises a flared opening.

18. The pin regulator of claim 13, wherein the edges of the regulating portion are rounded or flattened.

19. The pin regulator of claim 11, further comprising a main plate assembled on the base seat, wherein the main plate defines a receiving groove, and the base seat defines a cavity; the receiving groove and the cavity cooperatively receive the connecting base, the connecting bracket and part of the regulating member.

* * * * *